United States Patent
Yang

(10) Patent No.: US 8,120,185 B2
(45) Date of Patent: Feb. 21, 2012

(54) SEMICONDUCTOR DEVICE HAVING DECREASED CONTACT RESISTANCE AND METHOD FOR MANUFACTURING THE SAME

(75) Inventor: Hee Jung Yang, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 223 days.

(21) Appl. No.: 12/411,488

(22) Filed: Mar. 26, 2009

(65) Prior Publication Data

US 2010/0200997 A1 Aug. 12, 2010

(30) Foreign Application Priority Data

Feb. 11, 2009 (KR) .................. 10-2009-0011169

(51) Int. Cl.
*H01L 23/48* (2006.01)
*H01L 23/52* (2006.01)
*H01L 29/40* (2006.01)

(52) U.S. Cl. ................................. 257/775; 257/E23.011
(58) Field of Classification Search .................. 257/774, 257/775, E23.011
See application file for complete search history.

(56) References Cited

U.S. PATENT DOCUMENTS

| 6,734,561 B2 * | 5/2004 | Kawai ........................... 257/758 |
| 2004/0188842 A1 * | 9/2004 | Takewaka et al. ............ 257/758 |
| 2005/0269711 A1 * | 12/2005 | Rieger et al. .................. 257/774 |

FOREIGN PATENT DOCUMENTS

| KR | 10-0343653 B1 | 6/2002 |
| KR | 1020030049806 A | 6/2003 |
| KR | 10-0564578 B1 | 3/2006 |

* cited by examiner

*Primary Examiner* — Jenny L Wagner
(74) *Attorney, Agent, or Firm* — Ladas & Parry LLP

(57) ABSTRACT

A semiconductor device includes a first plug formed on a semiconductor substrate and exposed on side and upper surfaces of an upper part thereof and a second plug formed on the first plug to contact the exposed side and upper surfaces of the upper part of the first plug.

8 Claims, 9 Drawing Sheets

SEMICONDUCTOR DEVICE HAVING DECREASED CONTACT RESISTANCE AND METHOD FOR MANUFACTURING THE SAME

CROSS-REFERENCE TO RELATED APPLICATIONS

The present application claims priority to Korean patent application number 10-2009-0011169 filed on Feb. 11, 2009, which is incorporated herein by reference in its entirety.

BACKGROUND OF THE INVENTION

The present invention relates generally to a semiconductor device and a method for manufacturing the same, and more particularly, to a semiconductor device capable of decreasing contact resistance, to thereby improve characteristics and device reliability, and a method for manufacturing the same.

In a semiconductor device such as a dynamic random access memory (DRAM), landing plugs serve as a type of contact plugs that electrically connect source areas and drain areas of transistors with bit lines and capacitors. As the size of the semiconductor device gradually decreases and the level of integration is increased, there is a corresponding reduction in contact area, increase in contact resistance, and decrease in operation current. Due to this fact, the write recovery time (tWR) and refresh characteristics of the semiconductor device deteriorate, inevitably leading to degradation in the performance of the semiconductor device.

As a semiconductor design rule decreases, because the contact area of landing plugs is limited to the area between gates, a contact margin between the landing plugs and bit line contact plugs or between the landing plugs and storage node contact plugs decreases. This is problematic as it results in a gradual increase in contact resistance.

Under these situations, in order to decrease the contact resistance and increase the operation current of a semiconductor device, methods of increasing the concentration of the impurities doped in source areas and drain areas, increasing the concentration of the impurities doped in a polysilicon layer serving as a contact substance, and conducting an rapid thermal annealing (RTA) process have been adopted in the art. However, in such methods, leakage current is caused in the gates, and refresh characteristics deteriorate. Therefore, a method for decreasing contact resistance without causing leakage current or undergoing deterioration of refresh characteristics is required in the art.

SUMMARY OF THE INVENTION

Embodiments of the present invention include a semiconductor device capable of decreasing contact resistance and a method for manufacturing the same.

Also, embodiments of the present invention include a semiconductor device capable of improving characteristics and reliability thereof and a method for manufacturing the same.

In one aspect of the present invention, a semiconductor device comprises a first plug formed on a semiconductor substrate and exposed on side and upper surfaces of an upper part thereof; and a second plug formed on the first plug to contact the exposed side and upper surfaces of the upper part of the first plug.

The first plug comprises a landing plug.

The second plug comprises a bit line contact plug or a storage node contact plug.

In another aspect of the present invention, a semiconductor device comprises a first insulation layer formed on a semiconductor substrate; a first plug formed in the first insulation layer on the semiconductor substrate and exposed on side and upper surfaces of an upper part thereof due to recession of an adjoining portion of the first insulation layer; a second insulation layer formed on the first insulation layer to expose the first plug and the adjoining portion of the first insulation layer; and a second plug formed in the second insulation layer to contact the exposed side and upper surfaces of the upper part of the first plug.

The first plug comprises a landing plug.

The adjoining portion of the first insulation layer is recessed to a depth in the range of 10~2,000 Å.

The second plug comprises a bit line contact plug or a storage node contact plug.

A portion of the second plug, which contacts the side surface of the upper part of the first plug, and a portion of the second plug, which contacts the upper surface of the upper part of the first plug, are formed of different materials.

The portion of the second plug, which contacts the side surface of the upper part of the first plug, is formed of a material having lower resistance than a material of the portion of the second plug, which contacts the upper surface of the upper part of the first plug.

The portion of the second plug, which contacts the side surface of the upper part of the first plug, is formed of at least one of SiGe, a metal and a metal silicide, and the portion of the second plug, which contacts the upper surface of the upper part of the first plug, is formed of polysilicon.

In another aspect of the present invention, a semiconductor device comprises a semiconductor substrate having active regions; a plurality of gate lines formed on the semiconductor substrate to extend in a first direction tilted with respect to the active regions; a first insulation layer formed on the semiconductor substrate which is formed with the gate lines; a first plug formed on the active region between the gate lines and exposed on side and upper surfaces of an upper part thereof due to recession of adjoining portions of the first insulation layer; a second insulation layer formed on the first insulation layer to expose the first plug and the adjoining portions of the first insulation layer; a second plug formed in the second insulation layer to contact the exposed side and upper surfaces of the upper part of the first plug; and a plurality of conductive patterns formed on the second insulation layer to contact second plugs.

The adjoining portions of the first insulation layer are recessed to a depth in the range of 10~2,000 Å.

The first plug comprises a landing plug.

The second plug comprises a bit line contact plug or a storage node contact plug.

Portions of the second plug, which contact the side surfaces of the upper part of the first plug, and a portion of the second plug, which contacts the upper surface of the upper part of the first plug, are formed of different materials.

The portions of the second plug, which contact the side surfaces of the upper part of the first plug, are formed of a material having lower resistance than a material of the portion of the second plug, which contacts the upper surface of the upper part of the first plug.

The portions of the second plug, which contact the side surfaces of the upper part of the first plug, are formed of at least one of SiGe, a metal and a metal silicide, and the portion of the second plug, which contacts the upper surface of the upper part of the first plug, is formed of polysilicon.

The conductive patterns comprise a plurality of bit lines which are formed to extend in a second direction perpendicular to the first direction.

The conductive patterns comprise storage nodes.

In still another aspect of the present invention, a method for manufacturing a semiconductor device comprises the steps of forming a first insulation layer on a semiconductor substrate; forming a first plug in the first insulation layer on the semiconductor substrate; forming a second insulation layer on the first plug and the first insulation layer; etching the second insulation layer to expose the first plug and recessing a portion of the first insulation layer which adjoins the first plug, to expose side and upper surfaces of an upper part of the first plug; and forming a second plug on the first plug and on the portion of the first insulation layer to contact the side and upper surfaces of the upper part of the first plug.

The first plug is formed as a landing plug.

The portion of the first insulation layer is recessed to a depth in the range of 10~2,000 Å.

The step of etching the second insulation layer and recessing the portion of the first insulation layer comprises the steps of forming a mask pattern on the second insulation layer to expose a portion of the second insulation layer which is placed on the first plug; etching the exposed portion of the second insulation layer and a portion of the first insulation layer using the mask pattern as an etch mask; and removing the mask pattern.

When viewed from the top, the portion of the second insulation layer, which is exposed through the mask pattern, has a larger area than the first plug.

The second plug is formed as a bit line contact plug or a storage node contact plug.

A portion of the second plug, which contacts the side surface of the upper part of the first plug, and a portion of the second plug, which contacts the upper surface of the upper part of the first plug, are formed of different materials.

The portion of the second plug, which contacts the side surface of the upper part of the first plug, is formed of a material having lower resistance than a material of the portion of the second plug, which contacts the upper surface of the upper part of the first plug.

The portion of the second plug, which contacts the side surface of the upper part of the first plug, is formed of at least one of SiGe, a metal and a metal silicide, and the portion of the second plug, which contacts the upper surface of the upper part of the first plug, is formed of polysilicon.

In a still further aspect of the present invention, a method for manufacturing a semiconductor device comprises the steps of delimiting active regions in a semiconductor substrate; forming a plurality of gate lines on the semiconductor substrate to extend in a first direction tilted with respect to the active regions; forming a first insulation layer on the semiconductor substrate which is formed with the gate lines; forming a first plug on the active region in the first insulation layer; forming a second insulation layer on the first plug and the first insulation layer; etching the second insulation layer to expose the first plug and recessing portions of the first insulation layer which adjoin the first plug, to expose side and upper surfaces of an upper part of the first plug; forming a second plug on the first plug and on the portions of the insulation layer to contact the exposed side and upper surfaces of the upper part of the first plug; and forming a plurality of conductive patterns on the second insulation layer to contact second plugs.

The first plug is formed as a landing plug.

The portions of the first insulation layer are recessed to a depth in the range of 10~2,000 Å.

The step of etching the second insulation layer and recessing the portions of the first insulation layer comprises the steps of forming a mask pattern on the second insulation layer to expose a portion of the second insulation layer which is placed on the first plug; etching the exposed portion of the second insulation layer and portions of the first insulation layer using the mask pattern as an etch mask; and removing the mask pattern.

When viewed from the top, the portion of the second insulation layer, which is exposed through the mask pattern, has a larger area than the first plug.

The second plug is formed as a bit line contact plug or a storage node contact plug.

Portions of the second plug, which contact the side surfaces of the upper part of the first plug, and a portion of the second plug, which contacts the upper surface of the upper part of the first plug, are formed of different materials.

The portions of the second plug, which contact the side surfaces of the upper part of the first plug, are formed of a material having lower resistance than a material of the portion of the second plug, which contacts the upper surface of the upper part of the first plug.

The portions of the second plug, which contact the side surfaces of the upper part of the first plug, are formed of at least one of SiGe, a metal and a metal silicide, and the portion of the second plug, which contacts the upper surface of the upper part of the first plug, is formed of polysilicon.

The conductive patterns comprise a plurality of bit lines which are formed to extend in a second direction perpendicular to the first direction.

The conductive patterns comprise storage nodes.

DESCRIPTION OF SPECIFIC EMBODIMENTS

In the present invention, a bit line contact plug or a storage node contact plug is formed on a landing plug such that the side and upper surfaces of the upper part of the landing plug are exposed, in such a way as to contact the exposed side and upper surfaces of the upper part of the landing plug. Through this, the contact area between the landing plug and the bit line contact plug, or between the landing plug and the storage node contact plug, can be increased. Accordingly, in the present invention, contact resistance can be decreased without causing leakage current or undergoing the degradation of refresh characteristics.

Hereafter, specific embodiments of the present invention will be described with reference to the accompanying drawings.

Figure 1:
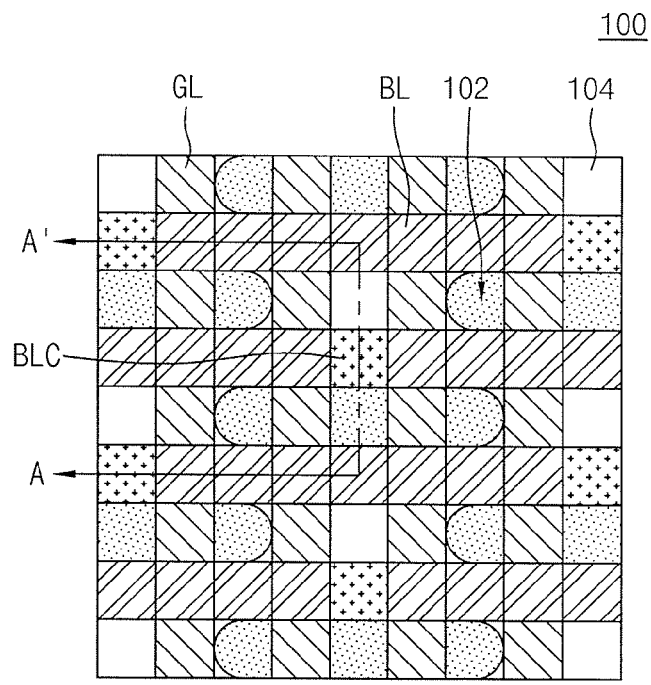
FIG. 1 is a plan view showing a semiconductor device in accordance with a first embodiment of the present invention.
Figure 2:
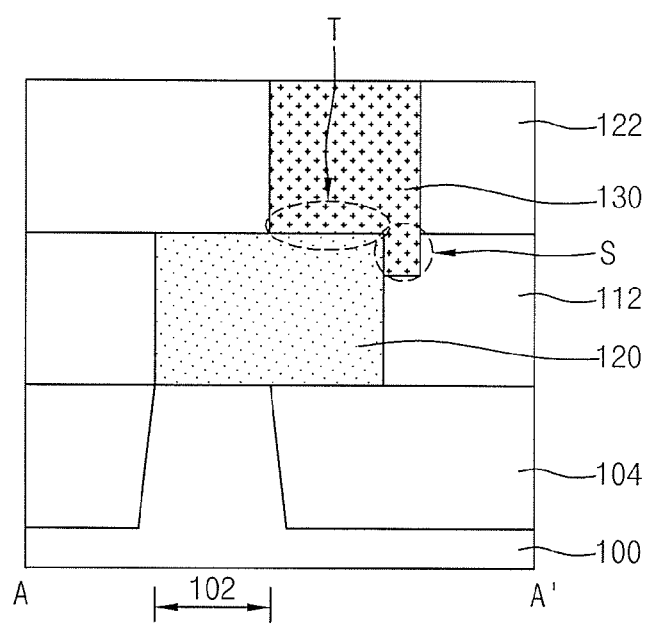
FIG. 2 is a cross-sectional view taken along the A-A' of FIG. 1, showing the semiconductor device in accordance with the first embodiment of the present invention.

FIG. 1 is a plan view showing a semiconductor device in accordance with a first embodiment of the present invention, and FIG. 2 is a cross-sectional view taken along the A-A' of FIG. 1, showing the semiconductor device in accordance with the first embodiment of the present invention. As shown in FIG. 1, a semiconductor device according to a first embodiment of the present invention includes active regions 102, gate lines GL, bit lines BL, and bit line contact areas BLC.

Referring to FIG. 2, an isolation structure 104 is formed in a semiconductor substrate 100 to delimit active regions, and a plurality of gate lines (not shown) are formed on the active regions and the isolation structure 104. A first insulation layer 112 is formed on the semiconductor substrate 100 to fill spaces between the gate lines GL. A first plug 120, for example, a landing plug, is formed in the first insulation layer 112, which is formed on the semiconductor substrate 100.

A portion of the first insulation layer 112 corresponding to a bit line contact area and adjoining the first plug 120 is recessed to a predetermined depth, the predetermined depth being such that the semiconductor substrate 100 is not exposed thereby, preferably, the recess is formed to have a depth in the range of 10~2,000 Å. As a consequence of the forming of the recess, the side and upper surfaces of the upper part of the first plug 120, which corresponds to the bit line contact area, are exposed.

A second insulation layer 122 is formed on the first insulation layer 112 and the first plug 120 such that a portion of the first plug 120 and an adjoining portion of the first insulation layer 112, which correspond to the bit line contact area, are exposed. A second plug 130, for example, a bit line contact plug, is formed in the second insulation layer 122 so as to contact the exposed side and upper surfaces of the upper part of the first plug 120 as shown in FIG. 2.

A portion S of the second plug 130 contacts the side surface of the upper part of the first plug 120 and a portion T of the second plug 130 contacts the upper surface of the upper part of the first plug 120. According to an embodiment of the present invention, the portions S and T of the second plug 130 are formed of different materials. In detail, the portion S of the second plug 130, which contacts the side surface of the upper part of the first plug 120, is formed of a material having lower resistance than a material of the portion T of the second plug 130, which contacts the upper surface of the upper part of the first plug 120. For example, the portion S of the second plug 130, which contacts the side surface of the upper part of the first plug 120, is formed of at least one of SiGe, a metal, and a metal silicide, and the portion T of the second plug 130, which contacts the upper surface of the upper part of the first plug 120, is formed of polysilicon.

As described above, the semiconductor device according to the first embodiment of the present invention includes the first plug 120, and a side surface and the upper surfaces of the upper portion of the first plug 120 are exposed due to the recession of the adjoining portion of the first insulation layer 112. The semiconductor device according to the first embodiment further includes the second plug 130 formed to contact the exposed side and upper surfaces of the upper part of the first plug 120. Thus, in the present invention, the contact area between the first plug 120 and the second plug 130 is increased, thereby reducing the contact resistance. In particular, in the first embodiment of the present invention, since the portion S of the second plug 130, which contacts the side surface of the upper part of the first plug 120, is formed of a material having a relatively low resistance, contact resistance can be effectively decreased.

While it was described in the above embodiment that the second plug 130 comprises a bit line contact plug, the present invention is not limited as such, for example, it is conceivable that the second plug 130 can comprise a storage node contact plug. Further, embodiments of the present invention can be applied to various types of contact plugs used in various types of semiconductor devices.

FIGS. 3A through 3E are cross-sectional views shown for illustrating the processes of a method for manufacturing the semiconductor device in accordance with the first embodiment of the present invention.

Figure 3A:
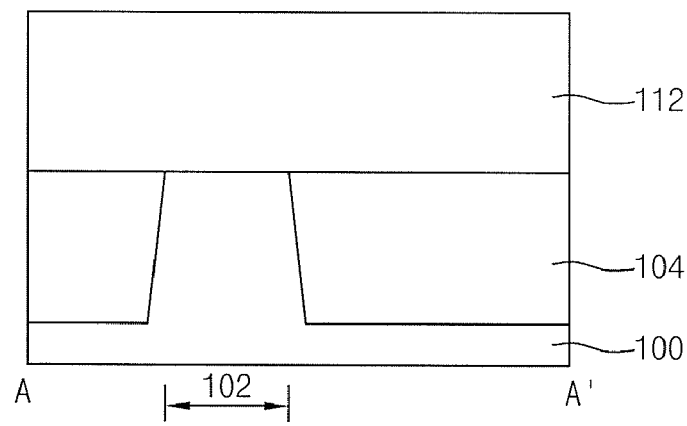
FIGS. 3A through 3E are cross-sectional views shown for illustrating the processes of a method for manufacturing a semiconductor device in accordance with the first embodiment of the present invention.

Referring to FIG. 3A, an isolation structure 104 is formed in a semiconductor substrate 100 to delimit active regions. Subsequently, a plurality of gate lines (not shown) are formed on the active regions and the isolation structure 104. A first insulation layer 112 is formed on the semiconductor substrate 100 to fill the spaces between the gate lines. Preferably, the first insulation layer 112 is then planarized to expose the upper surfaces of the gate lines.

Figure 3B:
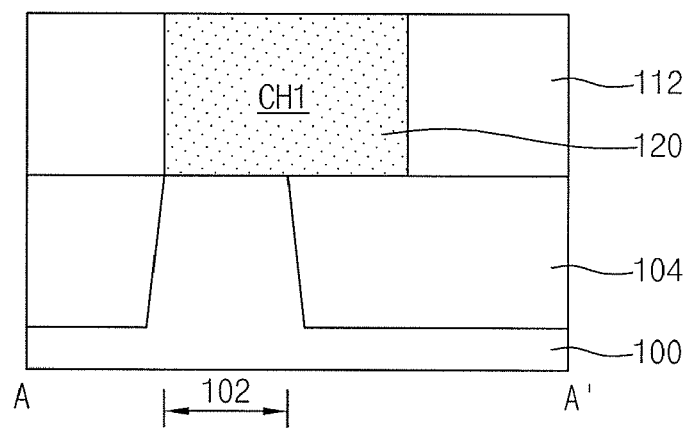

Referring to FIG. 3B, a portion of the planarized first insulation layer 112 is etched so as to define a first contact hole CH1 for a landing plug exposing a portion of the semiconductor substrate 100. Thereupon, a first plug 120, for example, a landing plug, is formed in the first contact hole CH1. The landing plug may comprise, for example, a doped polysilicon layer.

Figure 3C:
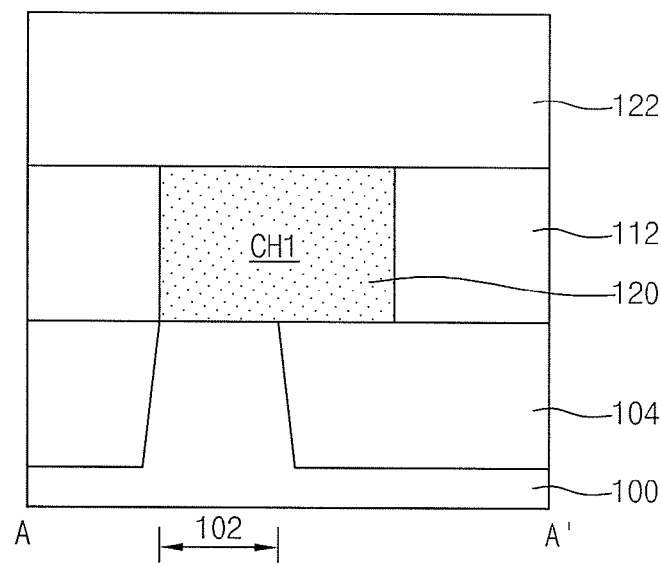

Referring to FIG. 3C, a second insulation layer 122 is formed on the first plug 120 and the first insulation layer 112. Subsequently, it is preferable that a planarization process be conducted to planarize the upper surface of the second insulation layer 122.

Figure 3D:
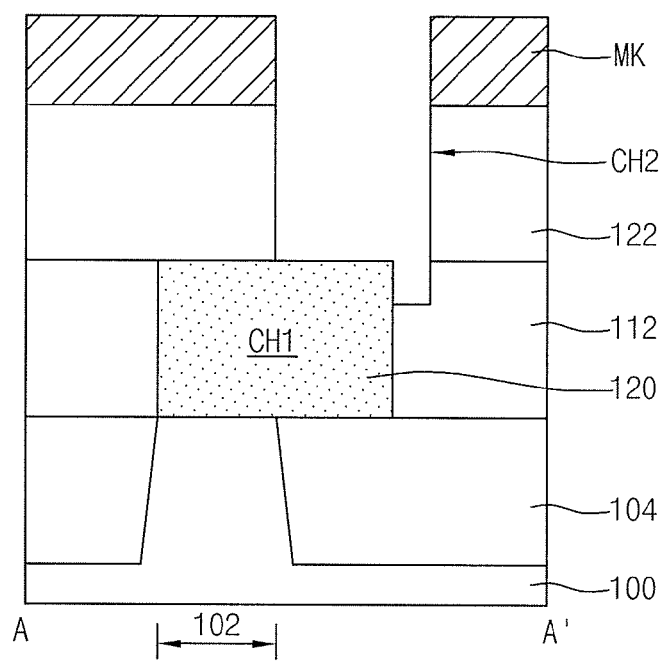

Referring to FIG. 3D, a mask pattern MK is formed on the planarized second insulation layer 122 in such a way as to expose a portion of the second insulation layer 122 formed on the first plug 120, which corresponds to a bit line contact area. Here, when viewed from above, the portion of the second insulation layer 122, which is exposed through the mask pattern MK in the bit line contact area, has a larger area than the portion of the first plug 120 that corresponds to the opening of the mask pattern MK. That is, the opening of the mask pattern corresponds to a portion of the first plug 120 and a portion of the first insulation layer 112 adjoining the first plug 120.

Thereafter, the exposed portion of the second insulation layer 122 is etched using the mask pattern MK as an etch mask so as to define a second contact hole CH2 for a bit line contact plug, and at the same time, an underlying portion of the first insulation layer 112 is recessed. The recessing is implemented to a partial depth of the first insulation layer 112 such that the semiconductor substrate 100 is not exposed, for example, the recessing may be in the range of 10~2,000 Å.

Since the portion of the second insulation layer 122 which is exposed through the mask pattern MK in the bit line contact area has a larger area than corresponding portion of the first plug 120, when conducting the etching process the portion of the first insulation layer 112 that adjoins the first plug 120 can be selectively recessed. As a result, both the side and upper surfaces of the upper part of the first plug 120, which correspond to the bit line contact area, are exposed due to the defining of the recession of the first insulation layer 112.

Figure 3E:
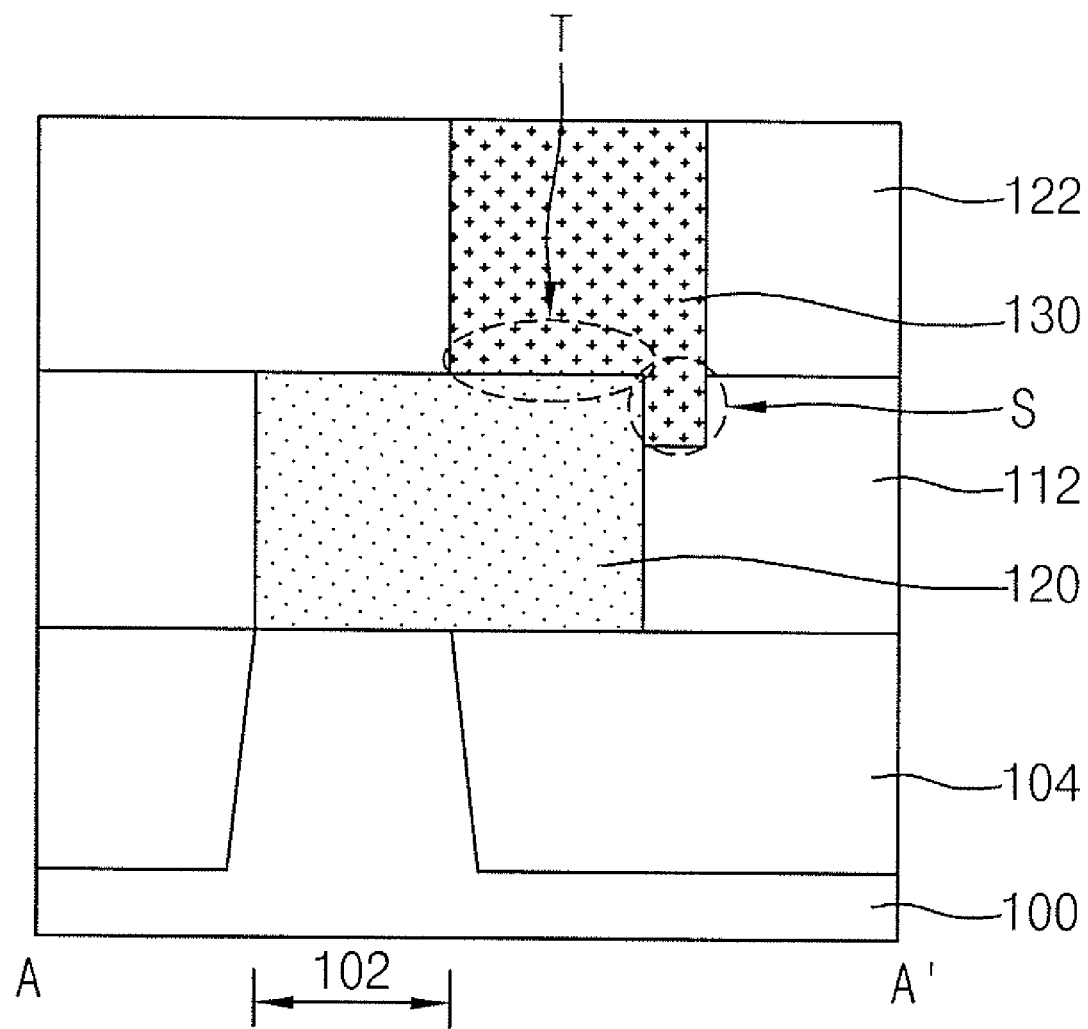

Referring to FIG. 3E, after the mask pattern MK is removed, a second plug 130 is formed on the first plug 120 and the adjoining portion of the first insulation layer 112, corresponding to the recession, in the second contact hole CH2 so as to contact the side and upper surfaces of the upper part of the first plug 120. The second plug 130 is formed as, for example, one of a bit line contact plug, a storage node contact plug, and the like.

Here, it is preferred that a portion S of the second plug 130 contacts the side surface of the upper part of the first plug 120 and a portion T of the second plug 130 contacts the upper surface of the upper part of the first plug 120. According to am embodiment of the present invention, the portions S and T of the second plug 130 are formed of different materials. In detail, the portion S of the second plug 130, which contacts the side surface of the upper part of the first plug 120, is formed of a material having lower resistance than a material of the portion T of the second plug 130, which contacts the upper surface of the upper part of the first plug 120. For example, according to an embodiment of the present invention, the portion S of the second plug 130, which contacts the side surface of the upper part of the first plug 120, is formed of at least one of SiGe, a metal, and a metal silicide, and the portion T of the second plug 130, which contacts the upper surface of the upper part of the first plug 120, is formed of polysilicon.

Thereafter, while not shown in the drawings, by sequentially conducting a series of well-known subsequent processes, the manufacture of the semiconductor device according to the first embodiment of the present invention is completed.

As is apparent from the above description, in the first embodiment of the present invention, a mask pattern exposing a portion of a second insulation layer which has a larger area than the portion of the first plug that corresponds to the opening of the mask pattern is used to define a recessed portion of a first insulation layer, which adjoins a first plug, such that the side and upper surfaces of the upper part of the first plug can be exposed.

Also, according to the first embodiment of the present invention, the contact area between the first and second plugs can be increased by forming a second plug in such a way as to contact the exposed side and upper surfaces of the upper part of the first plug. Therefore, in the present invention, since the contact area between the first and second plugs is increased, contact resistance can be decreased.

Additionally, according to the first embodiment of the present invention, since a portion of the second plug that contacts the exposed side surface of the upper part of the first plug can be formed of a material having relatively low resistance, the contact resistance between the first and second plugs can be effectively decreased.

Furthermore, according to the first embodiment of the present invention increasing the concentration of the impurities doped into the plugs or conduct an RTA process so as to decrease the contact resistance between the first and second plugs is not necessary, and as such it is possible to prevent current leakage from being caused in gates and refresh characteristics from degrading. Accordingly, in the present invention, the characteristics and the reliability of a semiconductor device can be improved.

Figure 4:
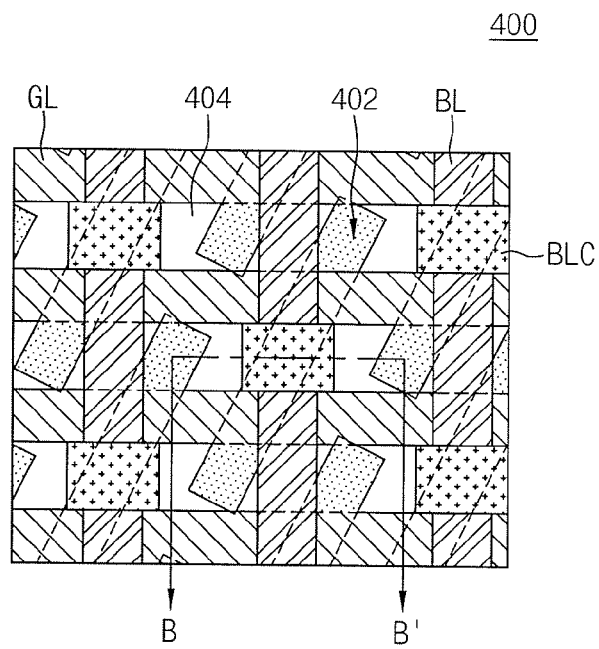
FIG. 4 is a plan view showing a semiconductor device in accordance with a second embodiment of the present invention having tilting active regions.
Figure 5:
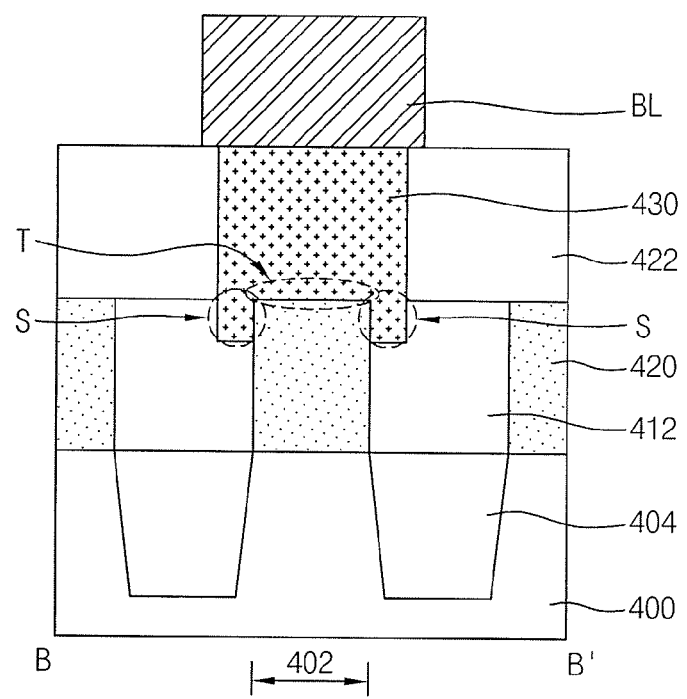
FIG. 5 is a cross-sectional view taken along the B-B' of FIG. 4, showing the semiconductor device in accordance with the second embodiment of the present invention.

FIG. 4 is a plan view showing a semiconductor device in accordance with a second embodiment of the present invention, wherein the layout includes tilting active regions so as to reduce a cell area, and FIG. 5 is a cross-sectional view taken along the B-B' of FIG. 4, showing the semiconductor device in accordance with the second embodiment of the present invention. As shown in FIG. 4, a semiconductor device according to a second embodiment of the present invention includes active regions 402, gate lines GL, bit lines BL, and bit line contact areas BLC.

Referring to FIGS. 4 and 5, an isolation structure 404 is formed in a semiconductor substrate 400 to delimit the active regions 402, and the plurality of gate lines GL are formed on the semiconductor substrate 400 including the active regions 402 and the isolation structure 404 in such a way as to extend in a first direction tilted with respect to the active regions 402.

A first insulation layer 412 is formed on the semiconductor substrate 400 formed with the gate lines GL to fill the spaces between the gate lines GL. A first plug 420, for example, a landing plug, is formed in the first insulation layer 412 between the gate lines GL corresponding to the active region 402. Here, portions of the first insulation layer 412, which adjoin the first plug 420, are recessed to a partial depth such that the semiconductor substrate 400 is not exposed by the recess, preferably, the recess is formed to have a depth in the range of 10~2,000 Å. As a consequence of forming the recess, the side and upper surfaces of the upper part of the first plug 420 are exposed.

A second insulation layer 422 is formed on the first insulation layer 412 such that a portion of the first plug 420 and adjoining portions of the first insulation layer 412 are exposed. A second plug 430, for example, a bit line contact plug, is formed in the second insulation layer 422 in such a way as to contact the exposed side and upper surfaces of the upper part of the first plug 420 as shown in FIG. 5.

Portions S of the second plug 430 contact the side surfaces of the upper part of the first plug 420, and a portion T of the second plug 430 contacts the upper (top) surface of the upper part of the first plug 420. According to an embodiment of the present invention, the portions S and T of the second plug 230 are formed of different materials. In detail, the portions S of the second plug 430, which contact the side surfaces of the upper part of the first plug 420, are formed of a material having lower resistance than a material of the portion T of the second plug 430, which contacts the upper surface of the upper part of the first plug 420. For example, the portions S of the second plug 430, which contact the side surfaces of the upper part of the first plug 420, are formed of at least one of SiGe, a metal, and a metal silicide, and the portion T of the second plug 430, which contacts the upper surface of the upper part of the first plug 420, is formed of polysilicon.

A plurality of conductive patterns are formed on the second insulation layer 422 in such a way as to contact second plugs 430. For example, the conductive patterns may comprise the plurality of bit lines BL formed to extend in a second direction perpendicular to the first direction of the gate lines GL. The bit lines BL can be formed to have a width that is similar to, greater than, or less than that of the second plugs 430, i.e., the bit line contact plugs.

As described above, the semiconductor device according to the second embodiment of the present invention includes the first plug 420, and the side and upper surfaces of the upper part of the first plug 420 are exposed due to the recession of the adjoining portions of the first insulation layer 412. The second embodiment of the present invention further includes the second plug 430, which is formed to contact the exposed side and upper surfaces of the upper part of the first plug 420. Thus, in the present invention, the contact area between the first plug 420 and the second plug 430 is increased, whereby contact resistance can be decreased.

In particular, in the second embodiment of the present invention, since the portions S of the second plug 430, which contact the side surfaces of the upper part of the first plug 420, are formed of a material which has relatively low resistance, contact resistance can be effectively decreased.

While it was described and depicted in the above embodiment that the second plugs 430 comprise bit line contact plugs and the conductive patterns comprise bit lines BL, the present invention is not limited as such, for example, it is conceivable that the second plugs 430 can comprise storage node contact plugs and the conductive patterns can comprise storage nodes. Further, embodiments of the present invention can be applied to various types of contact plugs used in various types of semiconductor devices.

FIGS. 6A through 6G are cross-sectional views shown for illustrating the processes of a method for manufacturing the semiconductor device in accordance with the second embodiment of the present invention.

Figure 6A:
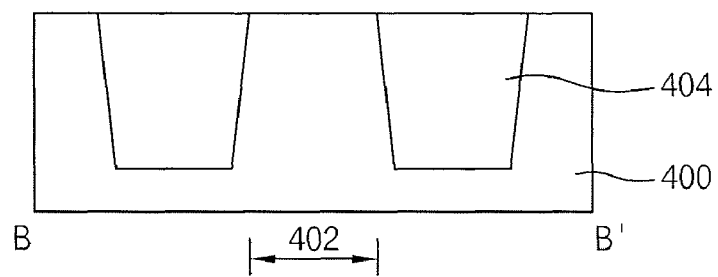
FIGS. 6A through 6G are cross-sectional views shown for illustrating the processes of a method for manufacturing a semiconductor device in accordance with the second embodiment of the present invention.

Referring to FIG. 6A, an isolation structure 404 is formed in a semiconductor substrate 400 to delimit active regions 402. Subsequently, a plurality of gate lines (not shown) (see FIG. 4) are formed on the semiconductor substrate 400 including the active regions 402 and the isolation structure 404 in such a way as to extend in a first direction tilted with respect to the active regions 402.

Figure 6B:
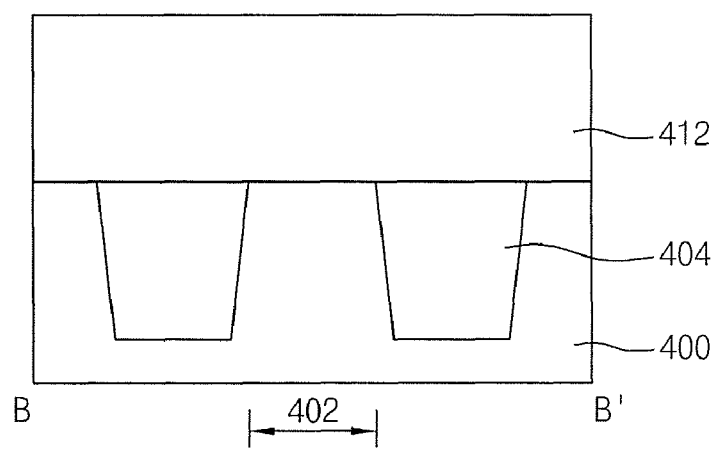

Referring to FIG. 6B, a first insulation layer 412 is formed on the semiconductor substrate 400 formed with the gate lines to fill the spaces between the gate lines. Preferably, the surface of the first insulation layer 412 is then planarized to expose the upper surfaces of the gate lines.

Figure 6C:
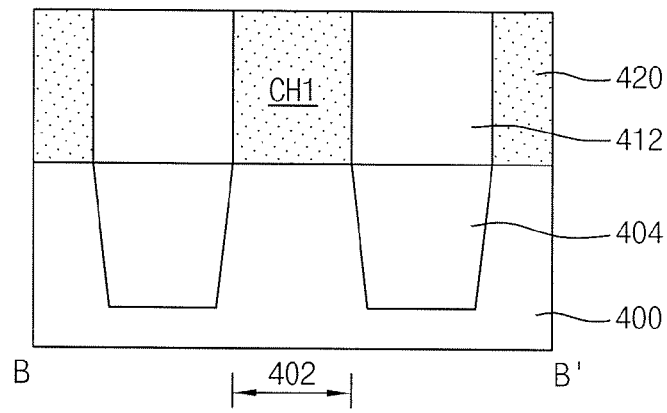

Referring to FIG. 6C, a portion of the first insulation layer 412 is etched so as to define a first contact hole CH1 exposing a portion of the active region 402 between the gate lines. Thereupon, a first plug 420, for example, a landing plug, is formed in the first contact hole CH1 within the first insulation layer 412 such that position of the first plug 420 corresponds to the active region 402.

Figure 6D:
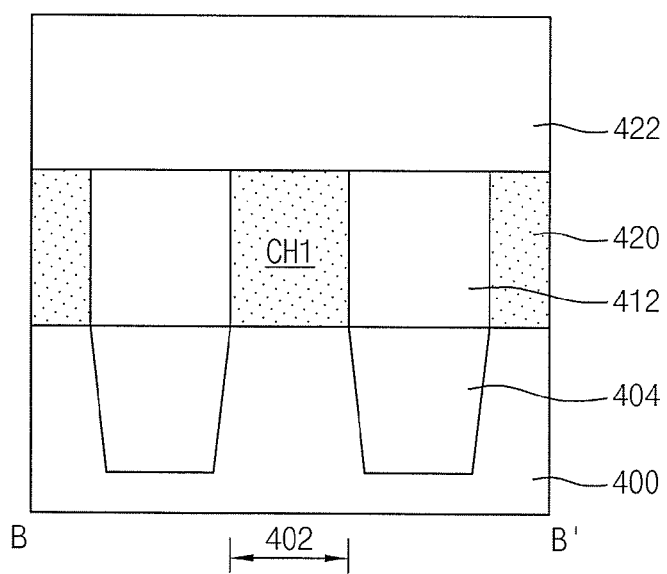

Referring to FIG. 6D, a second insulation layer 422 is formed on the first plug 420 and the first insulation layer 412. Subsequently, it is preferable that a planarization process be conducted to planarize the upper surface of the second insulation layer 422.

Figure 6E:
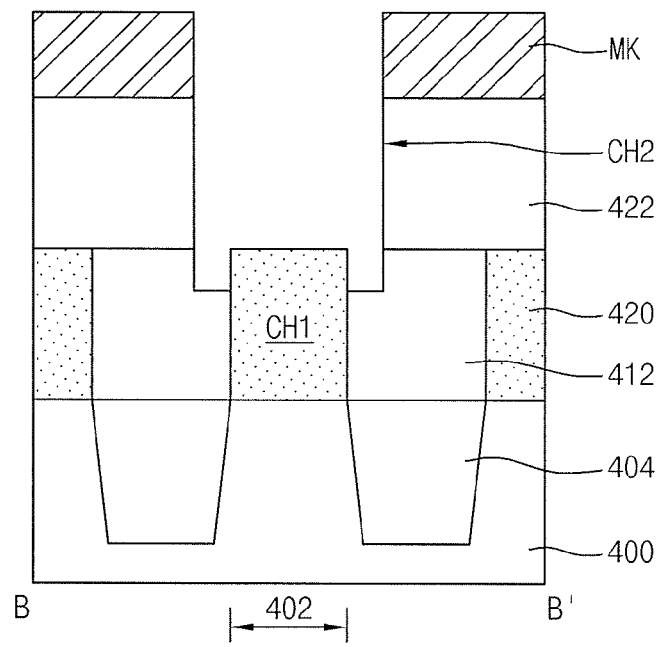

Referring to FIG. 6E, a mask pattern MK is formed on the second insulation layer 422 in such a way as to expose a portion of the second insulation layer 422, which is formed on the first plug 420. Here, when viewed from the top, the portion of the second insulation layer 422 exposed through the mask pattern MK has a larger area than the upper surface first plug 420.

Thereafter, the exposed portion of the second insulation layer 422 is etched using the mask pattern MK as an etch mask so as to define a second contact hole CH2 therein. During the etching of the second insulation layer 422 underlying portions of the first insulation layer 412 corresponding to the opening of the mask pattern MK are recessed. The recessing is implemented to a depth which is less than the thickness of the first insulation layer 412 such that the semiconductor substrate 400 is not exposed. For example, the recessing may be implemented to a depth in the range of 10~2,000 Å.

Since the portion of the second insulation layer 422 which is exposed through the mask pattern MK has a larger area than that of the first plug 420, when conducting the etching process, the portions of the first insulation layer 412 which adjoin the first plug 420 can be selectively recessed. As a result, both the side surfaces and the upper surface of the upper part of the first plug 420 are exposed due to the recession defined in the first insulation layer 412.

Figure 6F:
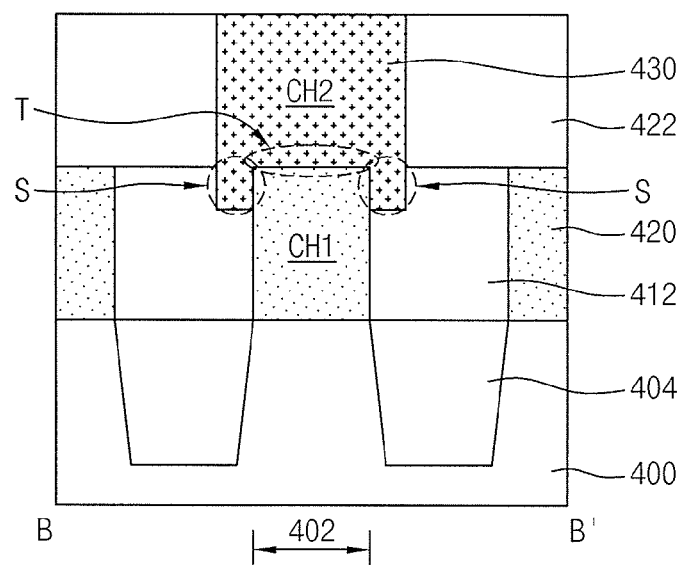

Referring to FIG. 6F, after the mask pattern MK is removed, a second plug 430 is formed on the first plug 420 and the adjoining portions of the first insulation layer 412 in the second contact hole CH2 so as to contact both the side and upper surfaces of the upper part of the first plug 420. The second plug 430 is formed as, for example, a bit line contact plug.

Here, it is preferred that portions S of the second plug 430, which contact the side surfaces of the upper part of the first plug 420, and a portion T of the second plug 430, which contacts the upper surface of the upper part of the first plug 420, be formed of different materials. In detail, the portions S of the second plug 430, which contact the side surfaces of the upper part of the first plug 420, are formed of a material having lower resistance than a material of the portion T of the second plug 430, which contacts the upper surface of the upper part of the first plug 420. For example, the portions S of the second plug 430, which contact the side surfaces of the upper part of the first plug 420, are formed of at least one of SiGe, a metal, and a metal silicide, and the portion T of the second plug 430, which contacts the upper surface of the upper part of the first plug 420, is formed of polysilicon.

Figure 6G:
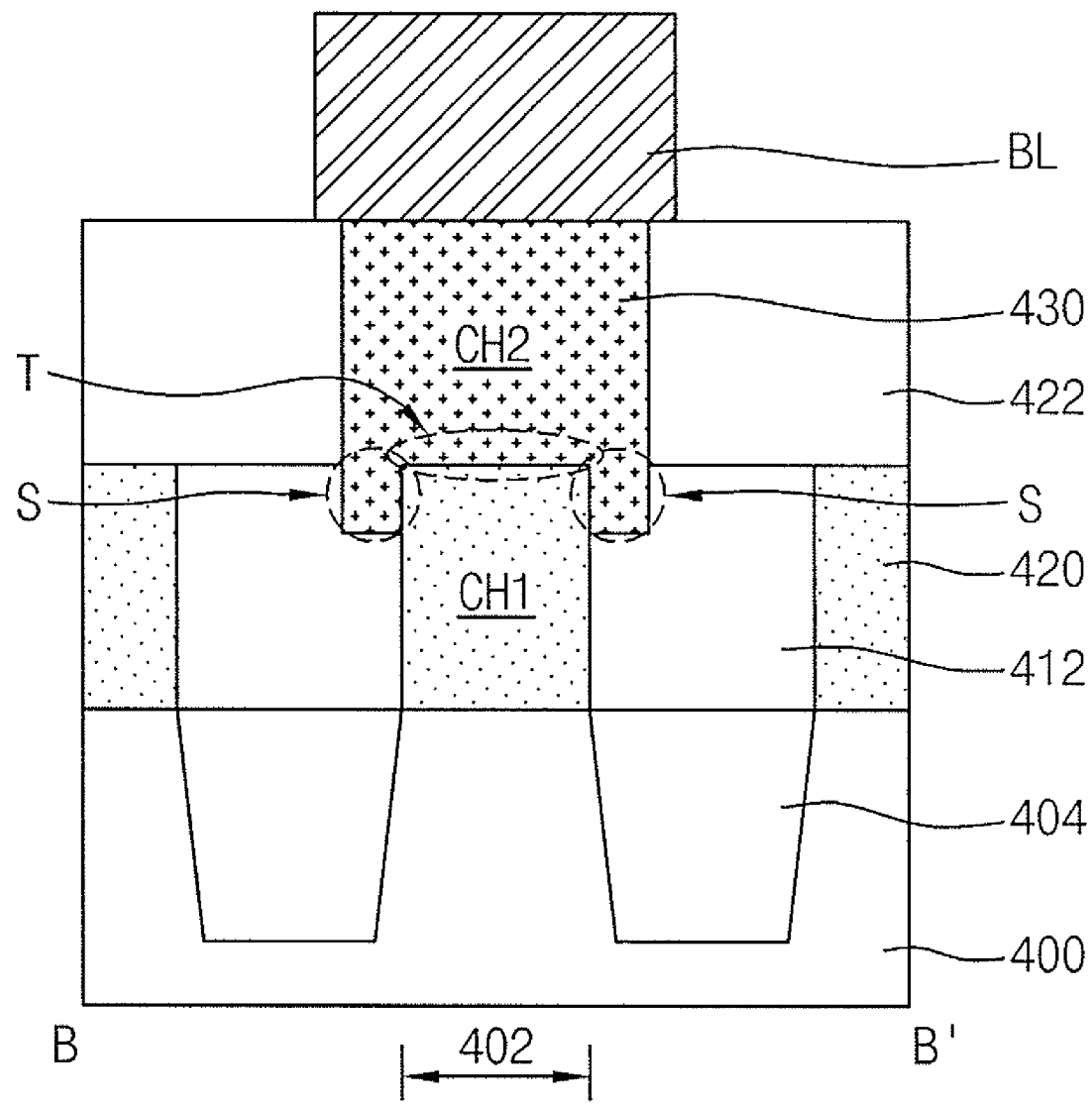

Referring to FIG. 6G, a plurality of conductive patterns are formed on the second insulation layer 422 so as to contact second plugs 430. For example, the conductive patterns may comprise a plurality of bit lines BL extending in a second direction perpendicular to the first direction of the gate lines. The bit lines BL can be formed to have a width that is similar to, greater than, or less than that of the second plugs 430, that is, the bit line contact plugs.

Thereafter, while not shown in the drawings, by sequentially conducting a series of well-known subsequent processes, the manufacture of the semiconductor device according to the second embodiment of the present invention is completed.

As is apparent from the above description, in the second embodiment of the present invention, a mask pattern exposing a portion of a second insulation layer which has a larger area than that of the upper surface of the first plug is used to define recessed portions of a first insulation layer, which adjoin a first plug, such that the side and upper surfaces of the upper part of the first plug can be exposed.

Also, according to the second embodiment of the present invention, the contact area between the first and second plugs can be increased by forming a second plug in such a way as to contact the exposed side and upper surfaces of the upper part of the first plug. Therefore, in the present invention, since the contact area between the first and second plugs is increased, contact resistance can be decreased.

In addition, according to the second embodiment of the present invention, since portions of the second plug that contact the exposed side surfaces of the upper part of the first plug can be formed of a material having relatively low resistance, the contact resistance between the first and second plugs can be effectively decreased.

Furthermore, according to the second embodiment of the present invention, increasing the concentration of the impurities doped into the plugs or conduct an RTA process so as to decrease the contact resistance between the first and second plugs is not necessary, and as such it is possible to prevent current leakage from being caused in gates and refresh characteristics from degrading. Accordingly, in the present invention, the characteristics and the reliability of a semiconductor device can be improved.

While it was described and depicted in the above embodiment that the second plugs comprise bit line contact plugs and the conductive patterns comprise bit lines, the present invention is not limited in this way, and as such, for example, it is conceivable that the second plugs can comprise storage node contact plugs and the conductive patterns can comprise storage nodes. Further, embodiments of the present invention can be applied to various types of contact plugs used in various semiconductor devices.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
a first plug formed on a semiconductor substrate, wherein side and upper surfaces of an upper portion of the first plug are exposed; and
a second plug formed on the first plug to contact the exposed side and upper surfaces of the upper portion of the first plug, the second plug having a first portion contacting an upper surface of the first plug and a second portion contacting the side surface of the first plug, wherein the second portion of the second plug contacts two or more side surfaces of the first plug and wherein a lower surface of the second portion of second plug extends below a lower surface of the first portion of the second plug.

2. A semiconductor device comprising:
a first insulation layer formed on a semiconductor substrate;
a first plug formed in the first insulation layer on the semiconductor substrate, wherein a portion of the first insulation layer adjoining the first plug is recessed such that side and upper surfaces of an upper portion of the first plug are exposed;
a second insulation layer formed on the first insulation layer to expose the first plug and the recessed portion of the first insulation layer; and
a second plug formed in the second insulation layer to contact the exposed side and upper surfaces of the upper portion of the first plug, the second plug having a first portion contacting an upper surface of the first plug and a second portion contacting the side surface of the first plug, wherein the second portion of the second plug contacts two or more side surfaces of the first plug and wherein a lower surface of the second portion of second plug extends below a lower surface of the first portion of the second plug.

3. The semiconductor device according to claim 2, wherein a first portion of the second plug contacts the side surface of the upper portion of the first plug and a second portion of the second plug contacts the upper surface of the upper portion of the first plug, wherein the first portion of the second plug and the second portion of the second plug are formed of different materials.

4. The semiconductor device according to claim 3, wherein the first portion of the second plug is formed of a material having lower resistance than a material of the second portion of the second plug.

5. A semiconductor device comprising:
a semiconductor substrate having active regions;
a plurality of gate lines formed on the semiconductor substrate and extending in a first direction tilted with respect to the active regions;
a first insulation layer formed on the semiconductor substrate having the gate lines formed thereon;
a first plug formed on the active regions between the gate lines, wherein portions of the first insulation layer adjoining the first plug is recessed such that side and upper surfaces of an upper portion of the first plug are exposed;
a second insulation layer formed on the first insulation layer to expose the first plug and the recessed portions of the first insulation layer;
a second plug formed in the second insulation layer to contact the exposed side and upper surfaces of the upper portion of the first plug, the second plug having a first portion contacting the upper surface of the first plug and a second portion contacting the side surface of the first plug, wherein the second portion of the second plug contacts two or more side surfaces of the first plug and wherein a lower surface of the second plug extends below a lower surface of the first portion of the second plug; and
a plurality of conductive patterns formed on the second insulation layer to contact second plugs.

6. The semiconductor device according to claim 5, wherein first portions of the second plug contact the side surfaces of the upper portion of the first plug and a second portion of the second plug contacts the upper surface of the upper portion of the first plug, wherein the first portions of the second plug and the second plug are formed of different materials.

7. The semiconductor device according to claim 6, wherein the first portions of the second plug are formed of a material having lower resistance than a material of the second portion of the second plug.

8. The semiconductor device according to claim 5, wherein the conductive patterns comprise a plurality of bit lines extending in a second direction perpendicular to the first direction.

* * * * *